United States Patent
Yamanobe

[11] Patent Number: 5,989,927
[45] Date of Patent: Nov. 23, 1999

[54] NON-VOLATILE SEMICONDUCTOR AND MEMORY CELL AND METHOD FOR PRODUCTION THEREOF

[75] Inventor: Tomomi Yamanobe, Tokyo, Japan

[73] Assignee: Oki Electric Industry Co., Ltd., Tokyo, Japan

[21] Appl. No.: 09/003,521

[22] Filed: Jan. 6, 1998

Related U.S. Application Data

[62] Division of application No. 08/857,254, May 16, 1997, Pat. No. 5,780,886.

[30] Foreign Application Priority Data

May 30, 1996 [JP] Japan .................................... 8-137245

[51] Int. Cl.[6] .......................... H01L 21/00; H01L 21/336
[52] U.S. Cl. ................................................ 438/3; 438/287
[58] Field of Search ........................................ 438/3, 287

[56] References Cited

U.S. PATENT DOCUMENTS

| | | | |
|---|---|---|---|
| 5,146,299 | 9/1992 | Lamp et al. ............................. | 257/295 |
| 5,478,653 | 12/1995 | Guenzer .................................. | 428/446 |
| 5,519,234 | 5/1996 | Paz de Araujo et al. .............. | 257/295 |
| 5,576,564 | 11/1996 | Satoh et al. ............................ | 257/295 |
| 5,780,886 | 7/1998 | Yamanobe .............................. | 257/295 |

FOREIGN PATENT DOCUMENTS

| | | |
|---|---|---|
| 0 415 750 A1 | 3/1991 | European Pat. Off. . |
| 0 653 794 A1 | 5/1995 | European Pat. Off. . |
| 6-125066 | 5/1994 | Japan . |

OTHER PUBLICATIONS

Journal of Applied Physics, vol. 72, No. 11, Dec. 1, 1992, pp. 5517–5519, XP000323884 Joshi et al. "Rapid Thermally Processed Ferroelectric B!4TI3012 Thin Films".

Wescon Technical Papers, vol. 35, Nov. 1, 1991, pp. 390–393, XP000320562, Liddiard, "Ferroelectric Memories: An Emerging Technology".

Patent Abstracts of Japan, vol. 095, No. 007, Aug. 31, 1995, & JP 07 099257 A (Ricoh Co Ltd), Apr. 11, 1995.

IBM Technical Disclosure Bulletin, vol.30, No.8, Jan. 1, 1988, pp. 436/437 XP00011203 "Use of Conducting Oxides as a Diffusion barrier in Shallow Junction Semiconductor Devices".

ISSCC95/Session 4/Technology Directions: displays, Photonics and Ferroelectric Memories, "A Single–Transistor Ferroelectric Memory Cekll" Feb. 1995.

*Primary Examiner*—John F. Niebling
*Assistant Examiner*—Alexander G. Ghyka
*Attorney, Agent, or Firm*—Jones Volentine, LLP

[57] ABSTRACT

A non-volatile semiconductor memory cell employing a field effect transistor having a gate of the metal/ferroelectric structure or the metal/ferroelectric/metal/insulator structure, wherein the ferroelectric layer is a layer of bismuth titanate containing bismuth more than the stoichiometric quantity or a piled layer of bismuth titanate of the stoichiometric composition and bismuth titanate containing bismuth more than the stoichiometric quantity, both of which have a less amount of dielectric constant and remanent polarization, thereby enabling the non-volatile memory cell to memorize and erase binary information with a less amount of voltage to be applied to the gate.

4 Claims, 11 Drawing Sheets

F I G. 5 (A)
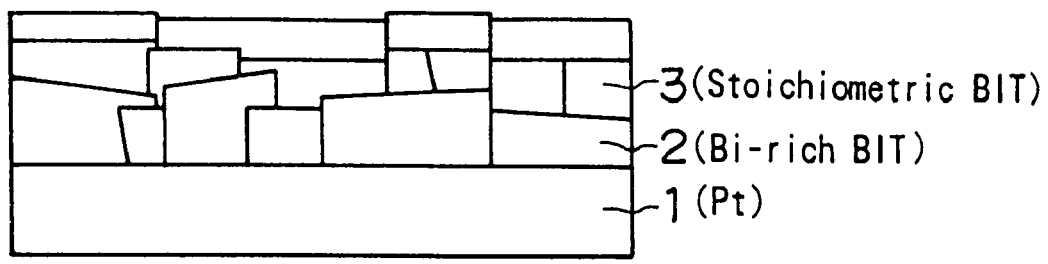
F I G. 5 (B)
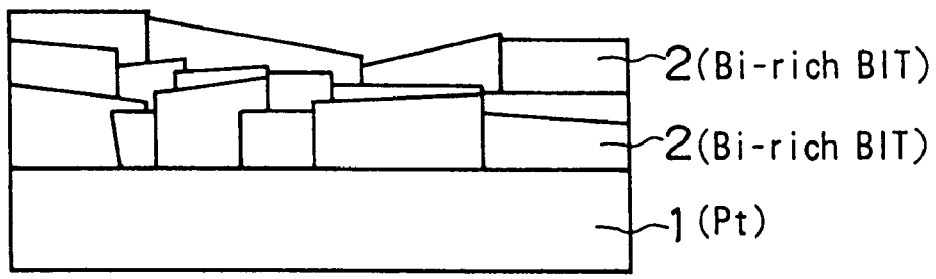

F I G. 8 (A)
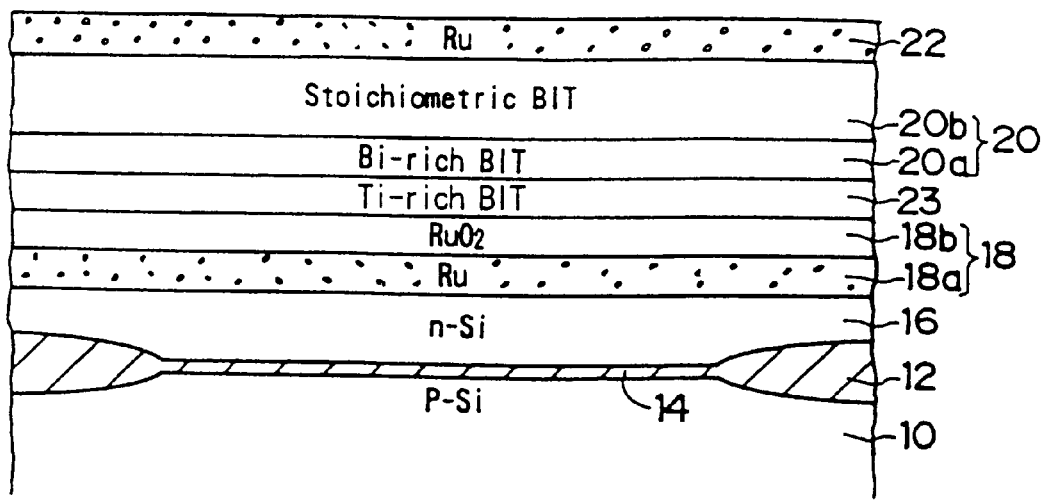
F I G. 8 (B)
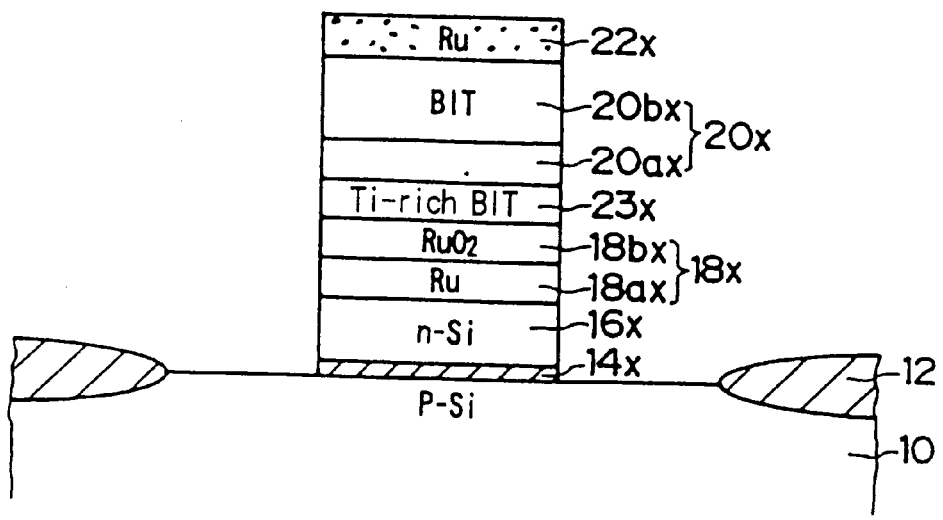

NON-VOLATILE SEMICONDUCTOR AND MEMORY CELL AND METHOD FOR PRODUCTION THEREOF

CROSS REFERENCE TO RELATED APPLICATIONS

This is a divisional application of application Ser. No. 08/857,254, filed May 16, 1997, now U.S. Pat. No. 5,780,886.

TECHNICAL FIELD

This invention relates to a non-volatile semiconductor memory cell under the category of a single transistor memory cell employing a field effect transistor having a ferroelectric layer as the gate insulator thereof and a method for producing the non-volatile semiconductor memory cell.

BACKGROUND OF THE INVENTION

A non-volatile semiconductor memory cell which employs a field effect transistor which further employs a ferroelectric material, such as lead zirconate titanate (Pb $(Zr_{0.52}Ti_{0.45})O_3$) and bismuth titanate ($Bi_4Ti_3O_{12}$), as the material for the gate insulator layer, is available in the prior art. The field effect transistor has a metal-ferroelectricsemiconductor (MFS) structure. Since a ferroelectric material has a large amount of remanent polarization, a field effect transistor having a gate insulator of a ferroelectric material has a memory function. In other words, once a positive voltage is applied to the gate electrode of an n-channel metal-ferroelectric-semiconductor (MFS) field effect transistor, polarization remains in the gate insulator made of a ferroelectric material even after the voltage is removed, due to the phenomenon of remanent polarization. As a result, an n-channel is memorized along the surface of the semiconductor layer. The memorized n-channel can readily be read out by applying a voltage across the n-channel or between a source and a drain. The memorized information can readily be erased by application of a negative voltage to the gate electrode of the n-channel MFS field effect transistor. When the MFS field effect transistor is a p-channel transistor, the polarity of the voltage to be applied to the gate electrode of the field effect transistor should be reversed to a negative voltage. In this manner, binary information which can be represented by existence or nonexistence of a drain current flowing in the MFS field effect transistor can be memorized in an MFS field effect transistor.

Since an MFS field effect transistor is involved with some problems, e.g. the difficulty of depositing a ferroelectric layer directly on a silicon substrate, formation of an unnecessary silicon dioxide layer during a thermal treatment and the like, however, a metal-ferroelectric-metal-insulator-semiconductor (MFMIS) field effect transistor was developed (ISSCC 95 February 1995 A Single-Transistor Ferroelectric Memory Cell T. Nakamura et al.).

The gate of a metal-ferroelectric-metal-insulator-semiconductor (MFMIS) field effect transistor is a series circuit of 2 capacitors including an upper capacitor consisting of an upper metal layer, a ferroelectric layer and a lower metal layer, and a lower capacitor consisting of the lower metal layer, an insulator layer and a semiconductor layer. The voltage applied to the gate is divided into two including the first voltage portion applied to the upper capacitor and the second voltage portion applied to the lower capacitor. Since the dielectric constant of a ferroelectric material is much larger than that of the ordinary insulator e.g. silicon dioxide, the capacity of the upper capacitor is much larger than that of the lower capacitor, resulting in a less amount of the first voltage portion and a larger amount of the second voltage portion. As a result, the intensity of the electric field becomes less in the ferroelectric layer, resulting in a less magnitude of remanent polarization in the ferroelectric layer. This causes malfunction for the non-volatile semiconductor memory cell.

An attempt to make the remanent polarization in the ferroelectric layer sufficiently large, is resultantly accompanied by a requirement to make the voltage to be applied to the second capacitor larger. As a result, the amount of the voltage to be applied between the gate electrode and the semiconductor layer or substrate is required to be larger. This causes a possibility of breakdown of the lower capacitor.

In conclusion, a non-volatile semiconductor memory cell employing a MFMIS field effect transistor is involved with a drawback in which a higher voltage is required for writing information therein.

OBJECTS AND SUMMARY OF THE INVENTION

An object of this invention is to provide a non-volatile semiconductor memory cell employing an MFS or MFMIS field effect transistor which allows a less amount of voltage to be applied between the gate electrode and the semiconductor substrate, to write a piece of binary information therein.

The other object of this invention is to provide a method for producing a non-volatile semiconductor memory cell employing an MFS or MFMIS field effect transistor which allows a less amount of the voltage to be applied between the gate electrode and the semiconductor substrate, to write a piece of binary information therein.

This invention is based on the concept tabulated below:

1. A dielectric material having a less amount of dielectric constant produces a capacitor having a less amount of capacity, when it is employed as the dielectric layer of the capacitor. A capacitor having a less amount of the capacity causes a larger amount of the voltage allotted to the capacitor, when it is connected in series with the other capacitor. Therefore, a layer of a ferroelectric material having a less amount of dielectric constant is effective to allot a larger amount of voltage to the upper capacitor, resultantly causing a larger amount of intensity of electric field in the ferroelectric layer of the upper capacitor with a less amount of voltage to be applied between the gate electrode and the semiconductor substrate.
2. A less amount of remanent polarization is effective to increase the intensity of electric field in the ferroelectric layer.
3. A layer of bismuth titanate containing bismuth more than the stoichiometric quantity, in which the direction of the c-axis is perpendicular to the surface of the bismuth titanate layer, has a less amount of dielectric constant and remanent polarization than a layer of bismuth titanate ($Bi_4Ti_3O_{12}$) of the stoichiometric composition.
4. A layer of bismuth titanate of the stoichiometric composition produced on a layer of bismuth titanate containing bismuth more than the stoichiometric quantity, in which the direction of the c-axis is perpendicular to the surface of the bismuth titanate layer, has a less amount of dielectric constant and remanent polarization than a layer of bismuth titanate ($Bi_4Ti_3O_{12}$) of the stoichiometric composition.

5. A layer of bismuth titanate of the stoichiometric composition produced on a layer of bismuth titanate containing bismuth more than the stoichiometric quantity, has a flat top surface.
6. A layer of bismuth titanate containing bismuth more than the stoichiometric quantity can be produced on a substrate by spin coating an organic solvent solution containing a bismuth source and a titanium source at a mole ratio at which bismuth component is more than 4 and the titanium component is 3, on the substrate and applying a thermal treatment process for drying and crystallizing the spin coated film.
7. A layer of bismuth titanate ($Bi_4Ti_3O_{12}$) of the stoichiometric composition can be produced on a substrate by spin coating an organic solvent solution containing a bismuth source and a titanium source at a mole ratio of 4:3 and applying a thermal treatment process for drying and crystallizing the spin coated film.

Accordingly, the first object of this invention can be achieved by any of the following non-volatile semiconductor memory cells.

The first one is a non-volatile memory cell comprising: a field effect transistor further comprising:
    a gate comprising a pile of an upper conductive layer and a ferroelectric layer of bismuth titanate containing bismuth more than the stoichiometric quantity, the pile being produced on the surface of a semiconductor layer of one conductivity, and
    a set of source and drain of the other conductivity produced in the surface region of the semiconductor layer of one conductivity, at the side of the foregoing gate.

The second one is a non-volatile memory cell comprising: a field effect transistor further comprising:
    a gate comprising a pile of an upper conductive layer and a ferroelectric layer comprising an upper layer of bismuth titanate of the stoichiometric composition and a lower layer of bismuth titanate containing bismuth more than the stoichiometric quantity, the pile being produced on the surface of a semiconductor layer of one conductivity, and a set of source and drain of the other conductivity produced in the surface region of the semiconductor layer of one conductivity, at the side of the foregoing gate.

The third one is a non-volatile memory cell comprising: a field effect transistor further comprising:
    a gate comprising a pile of an upper conductive layer, a ferroelectric layer of bismuth titanate containing bismuth more than the stoichiometric quantity, a lower conductive layer and an insulator layer, the pile being produced on the surface of a semiconductor layer of one conductivity, and a set of source and drain of the other conductivity produced in the surface region of the semiconductor layer of one conductivity, at the side of the foregoing gate.

The fourth one is a non-volatile memory cell comprising: a field effect transistor further comprising:
    a gate comprising a pile of an upper conductive layer, a ferroelectric layer comprising an upper layer of bismuth titanate of the stoichiometric composition and a lower layer of bismuth titanate containing bismuth more than the stoichiometric quantity, a lower conductive layer and an insulator layer, the pile being produced on the surface of a semiconductor layer of one conductivity, and
    a set of source and drain of the other conductivity produced in the surface region of the semiconductor layer of one conductivity, at the side of the foregoing gate.

The second object of this invention can be achieved by any of the following methods for producing a non-volatile semiconductor memory cell.

The first one is a method for producing a non-volatile semiconductor memory cell comprising:
    a step for producing a pile of layers comprising an upper conductive layer and a ferroelectric layer of bismuth titanate containing bismuth more than the stoichiometric quantity, on the surface of a semiconductor layer of one conductivity, a step for patterning the pile of layers to produce a gate and a step for introducing an impurity of the other conductivity in the semiconductor layer of one conductivity to produce a set of source and drain, at the side of the foregoing gate, to finally produce a field effect transistor, wherein:
        the step for producing the ferroelectric layer comprising a step for spin coating an organic solvent solution containing a bismuth source and a titanium source at a mole ratio at which the bismuth component is more than 4 and the titanium component is 3 and a step for applying a thermal treatment process for drying and crystallizing the foregoing spin coated film.

The second one is a method for producing a non-volatile semiconductor memory cell comprising:
    a step for producing a pile of layers comprising an upper conductive layer and a ferroelectric layer comprising an upper layer of bismuth titanate of the stoichiometric composition and a lower layer of bismuth titanate containing bismuth more than the stoichiometric quantity, on the surface of a semiconductor layer of one conductivity, a step for patterning the pile of layers to produce a gate and a step for introducing an impurity of the other conductivity in the semiconductor layer of one conductivity to produce a set of source and drain, at the side of the foregoing gate, to finally produce a field effect transistor, wherein:
        the step for producing the ferroelectric layer comprising a first step comprising a step for spin coating an organic solvent solution containing a bismuth source and a titanium source at a mole ratio at which the bismuth component is more than 4 and the titanium component is 3 and a step for applying a thermal treatment process for drying and crystallizing the foregoing spin coated film to produce the lower layer and a second step comprising a step for spin coating an organic solvent solution containing a bismuth source and a titanium source at a mole ratio of 4:3 and a step for applying a thermal treatment process for drying and crystallizing the foregoing spin coated film to produce the upper layer.

The third one is a method for producing a non-volatile semiconductor memory cell comprising:
    a step for producing a pile of layers comprising an upper conductive layer, a ferroelectric layer of bismuth titanate containing bismuth more than the stoichiometric quantity, a lower conductive layer and an insulator layer, on the surface of a semiconductor layer of one conductivity, a step for patterning the pile of layers to produce a gate and a step for introducing an impurity of the other conductivity in the semiconductor layer of one conductivity to produce a set of source and drain, at the side of said foregoing gate, to finally produce a field effect transistor, wherein:
        the step for producing the ferroelectric layer comprising a step for spin coating an organic solvent solution containing a bismuth source and a titanium source at a mole ratio at which the bismuth component is more than 4 and the titanium component is 3 and a step for applying a thermal treatment process for drying and crystallizing the foregoing spin coated film.

The fourth one is a method for producing a non-volatile semiconductor memory cell comprising:

a step for producing a pile of layers comprising an upper conductive layer, a ferroelectric layer comprising an upper layer of bismuth titanate of the stoichiometric composition and a lower layer of bismuth titanate containing bismuth more than the stoichiometric quantity, a lower conductive layer and an insulator layer, on the surface of a semiconductor layer of one conductivity, a step for patterning the pile of layers to produce a gate and a step for introducing an impurity of the other conductivity in the semiconductor layer of one conductivity to produce a set of source and drain, at the side of the foregoing gate, to finally produce a field effect transistor, wherein:

the step for producing the ferroelectric layer comprising a first step comprising a step for spin coating an organic solvent solution containing a bismuth source and a titanium source at a mole ratio at which the bismuth component is more than 4 and the titanium component is 3 and a step for applying a thermal treatment process for drying and crystallizing the foregoing spin coated film to produce the lower layer and a second step comprising a step for spin coating an organic solvent solution containing a bismuth source and a titanium source at a mole ratio of 4:3 and a step for applying a thermal treatment process for drying and crystallizing the foregoing spin coated film to produce the upper layer.

BRIEF DESCRIPTION OF THE DRAWINGS

This invention, together with its various features and advantages, can be readily understood from the following more detailed description presented in conjunction with the following drawings, in which:

FIG. 5(A) is a cross section of a piled layer in which a layer of bismuth titanate of the stoichiometric composition is produced on a layer of bismuth titanate containing bismuth more than the stoichiometric quantity, FIG. 5(B) is a cross section of a piled layer in which a layer of bismuth titanate containing bismuth more than the stoichiometric quantity is produced on a layer of bismuth titanate containing bismuth more than the stoichiometric quantity.

FIG. 8(A) is a cross section illustrating layer configuration of an MFMIS field effect transistor in accordance with a fourth embodiment of this invention, on the way of production, and FIG. 8(B) is a cross section illustrating layer configuration of an MFMIS field effect transistor in accordance with a fourth embodiment of this invention, on the way of production.

DETAILED DESCRIPTION OF THE PREFERRED EMBODIMENTS

Figure 1:
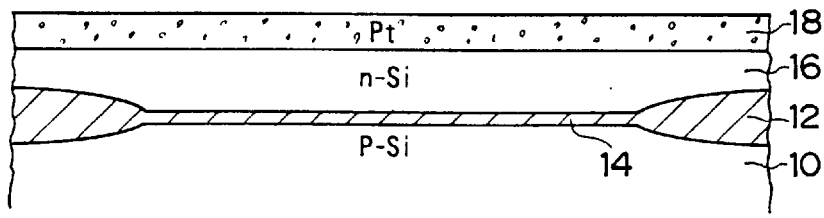
FIG. 1(A) is a cross section illustrating layer configuration of an MFMIS field effect transistor in accordance with a first embodiment of this invention, on the way of production.
FIG. 1(B) is a cross section illustrating layer configuration of an MFMIS field effect transistor in accordance with a first embodiment of this invention, on the way of production.
FIG. 1(C) is a cross section illustrating layer configuration of an MFMIS field effect transistor in accordance with a first embodiment of this invention, on the way of production.
FIG. 1(D) is a cross section illustrating layer configuration of an MFMIS field effect transistor in accordance with a first embodiment of this invention, on the way of production.
Figure 1:
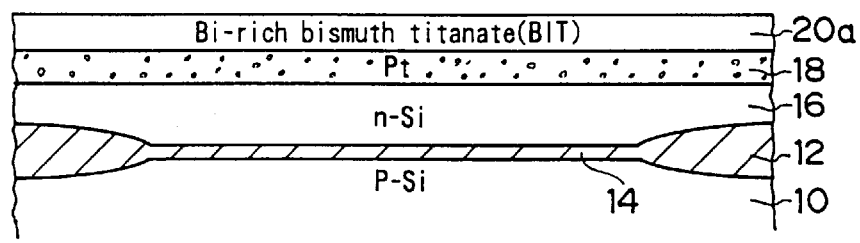
Figure 1:
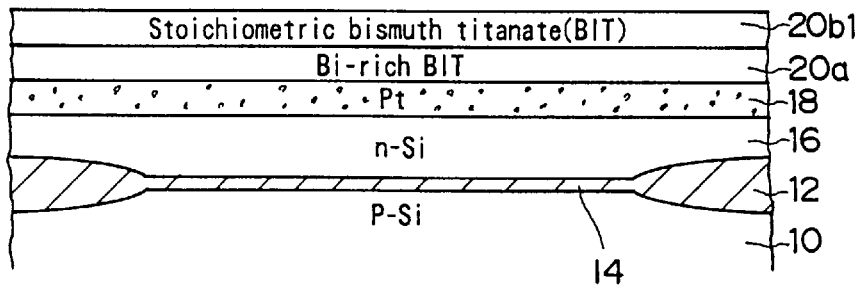
Figure 1:
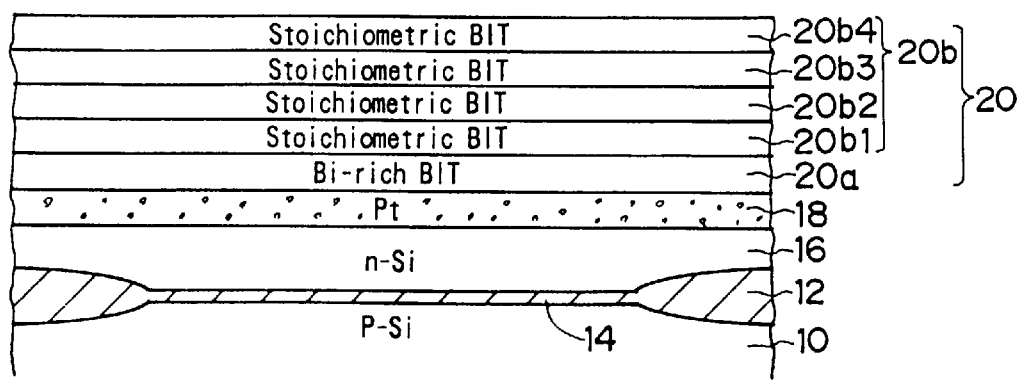
Figure 2:
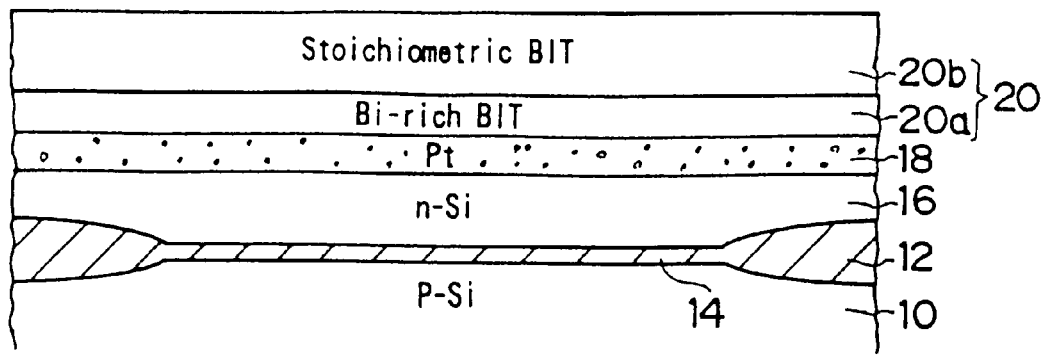
FIG. 2(A) is a cross section illustrating layer configuration of an MFMIS field effect transistor in accordance with a first embodiment of this invention, on the way of production.
FIG. 2(B) is a cross section illustrating layer configuration of an MFMIS field effect transistor in accordance with a first embodiment of this invention, on the way of production.
FIG. 2(C) is a cross section illustrating layer configuration of an MFMIS field effect transistor in accordance with a first embodiment of this invention, on the way of production.
Figure 2:
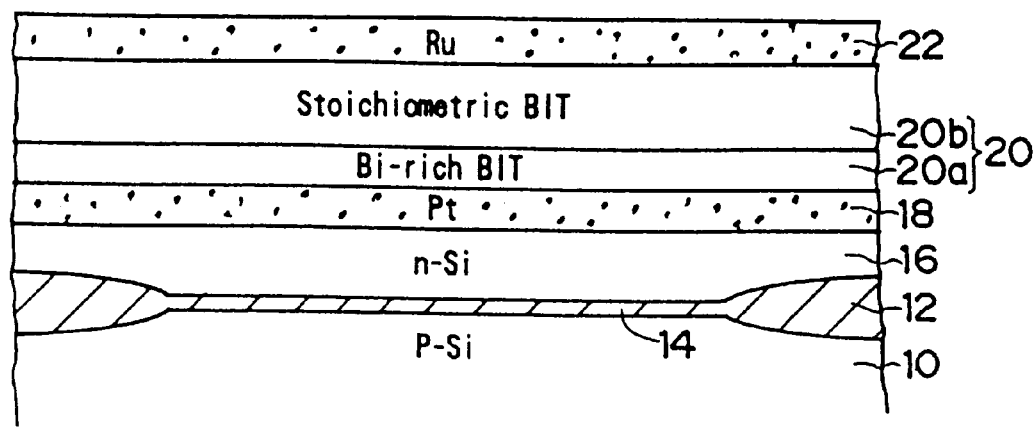
Figure 2:
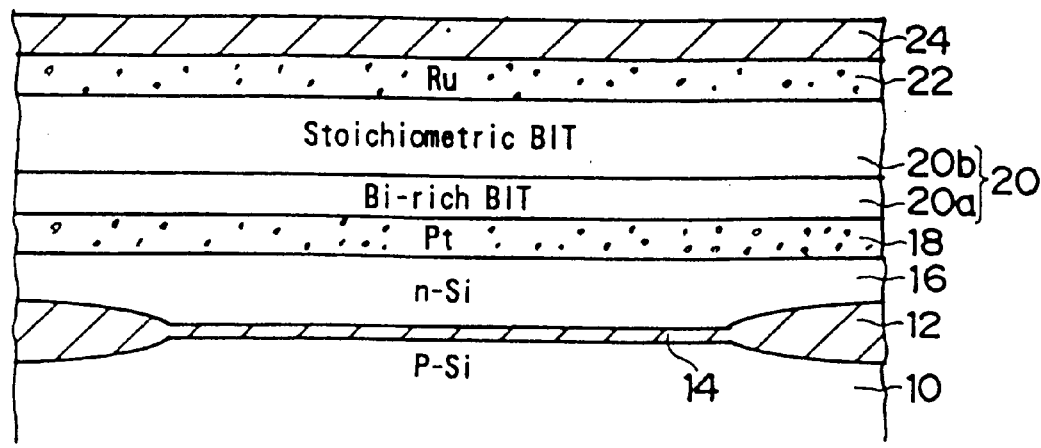
Figure 3:
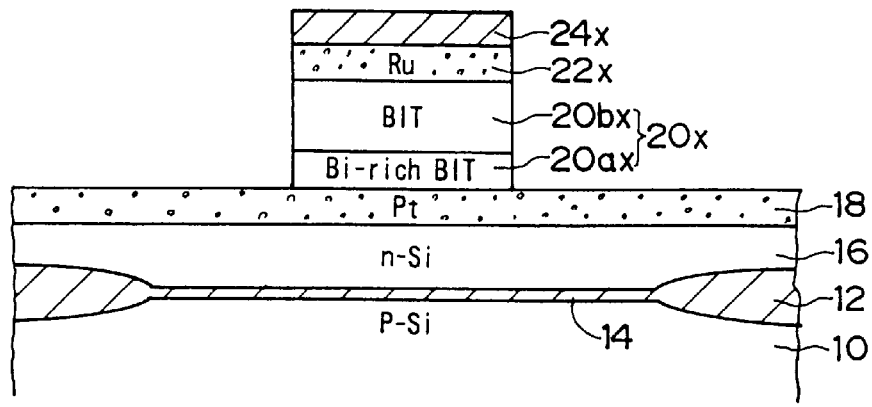
FIG. 3(A) is a cross section illustrating layer configuration of an MFMIS field effect transistor in accordance with a first embodiment of this invention, on the way of production.
FIG. 3(B) is a cross section illustrating layer configuration of an MFMIS field effect transistor in accordance with a first embodiment of ti invention, on the way of production.
FIG. 3(C) is a cross section illustrating layer configuration of an MFMIS field effect transistor in accordance with a first embodiment of this invention, on the way of production.
Figure 3:
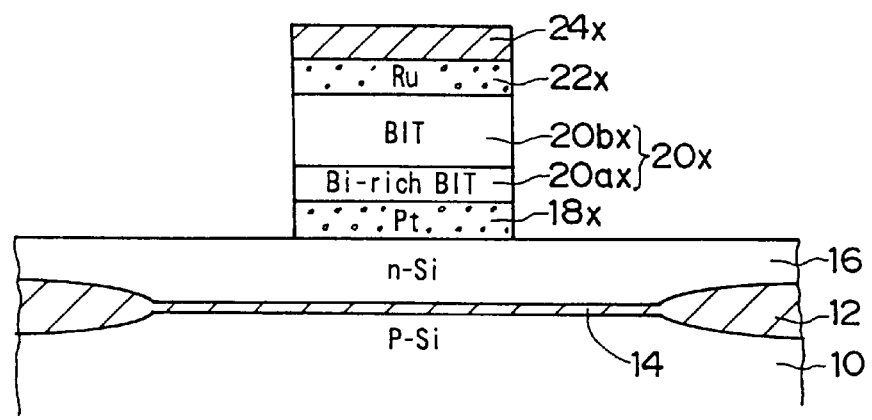
Figure 3:
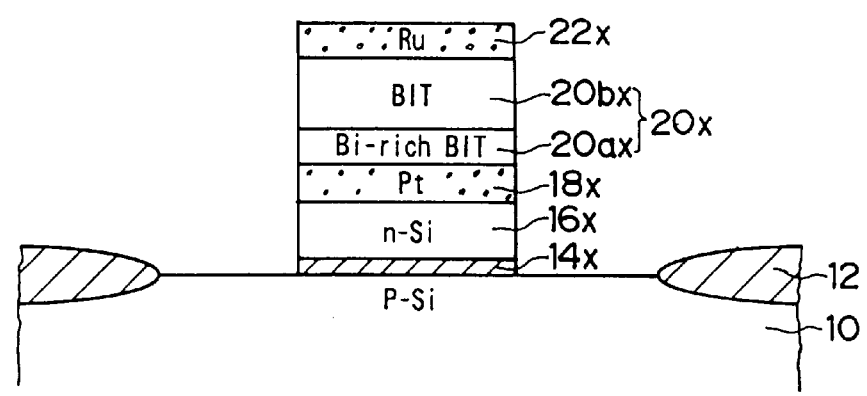
Figure 4:
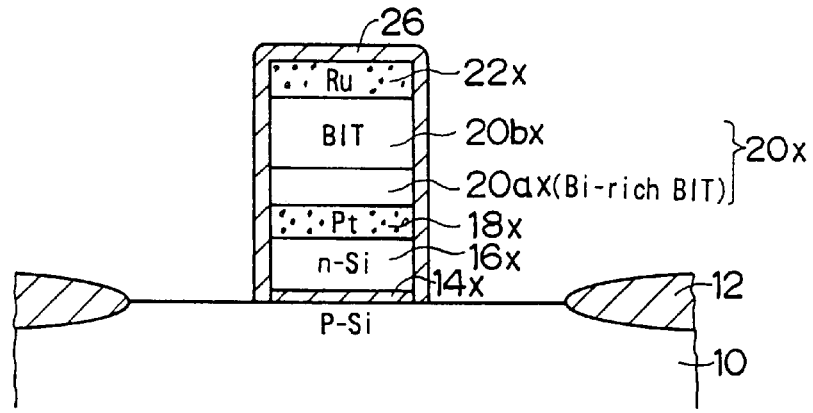
FIG. 4(A) is a cross section illustrating layer configuration of an MFMIS field effect transistor in accordance with a first embodiment of is invention, on the way of production.
FIG. 4(B) is a cross section illustrating layer configuration of an MFMIS field effect transistor in accordance with a first embodiment of this invention, on the way of production.
FIG. 4(C) is a cross section illustrating layer configuration of an MFMIS field effect transistor in accordance with a first embodiment of this invention, on the way of production.
Figure 4:
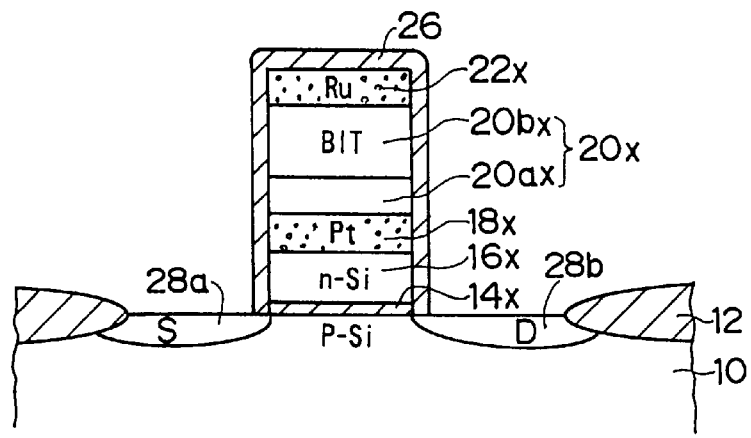
Figure 4:
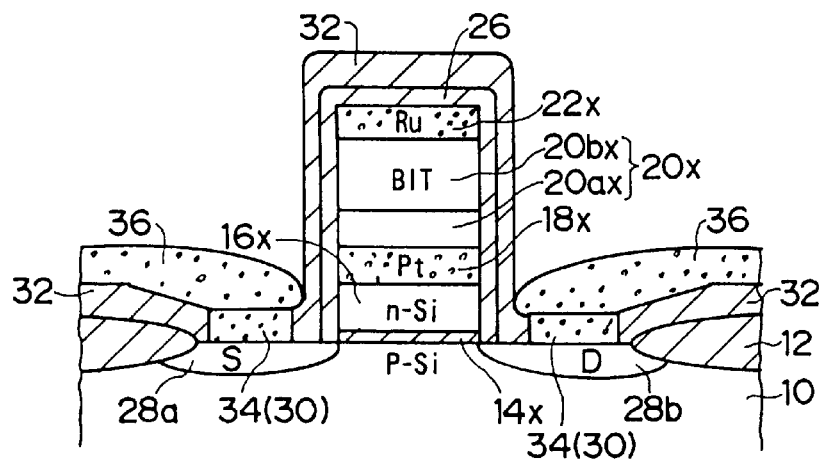

Referring to drawings, a detailed description will be presented below for non-volatile semiconductor memory cells in accordance with 4 embodiments of this invention.
First Embodiment A non-volatile semiconductor memory cell employing an MFMIS field effect transistor having a gate of a ruthenium/bismuth titanate of the stoichiometric composition/bismuth titanate containing bismuth more than the stoichiometric quantity/platinum/conductive silicon/silicon dioxide/silicon structure.

FIGS. 1 through 4 illustrate layer configuration of an MFMIS field effect transistor constituting a non-volatile semiconductor memory cell in accordance with a first embodiment of this invention, on the way of production. The drawings are drawn, concentrating an attention to the active region of the MFMIS field effect transistor.

Referring to FIG. 1(A), a LOCOS process or the like is employed to produce a field insulator layer 12 on the surface of a semiconductor (silicon in this embodiment) substrate 10 of one conductivity (p-type in this embodiment), remaining an active area on which an MFMIS field effect transistor is scheduled to be produced, uncovered by the field insulator layer 12. An oxidation process is employed to oxidize the surface region of the p-type silicon substrate 10 to produce a silicon dioxide layer 14 having an approximate thickness of 60 Å, which is scheduled to be a lower insulator layer or a so-called gate insulator layer. A rapid thermal annealer (RTA) is practically employed for the foregoing thermal processes. A reduced pressure chemical vapor deposition process which is conducted by employing monosilane ($SiH_4$) as the silicon source and phosphine ($PH_3$) as the source of an n-type impurity, is employed to produce a poly crystalline silicon layer 16 having an approximate thickness of 2000 Å. Thereafter, a thermal treatment process is applied to poly crystalline silicon layer 16 at 850° C. to activate the n-type impurity for the purpose to convert the poly crystalline silicon layer 16 to a conductive poly crystalline silicon layer 16 containing an n-type impurity (phosphorus) at the concentration of $4 \times 10^{20}$ $cm^{-3}$. A sputtering process is employed to produce a platinum layer 18 having the approximate thickness of 1000 Å. A piled layer of the platinum layer 18 and the conductive poly crystalline silicon layer 16 is scheduled to be employed as a lower conductive layer or a so-called floating gate.

Referring to FIG. 1(B), a first organic solvent solution containing a bismuth source and a titanium source at a mole ratio in which the bismuth component is more than the stoichiometric quantity of bismuth titanate ($Bi_4Ti_3O_{12}$) or at a mole ratio at which the bismuth component is more than 4 and the titanium component is 3, is spin coated on the surface of the platinum layer 18, and a two-step thermal treatment process is applied to the spin coated film to produce a lower layer of bismuth titanate 20a containing bismuth more than the stoichiometric quantity and having a thickness of e.g. 600 Å.

The direction of the c-axis of the lower layer 20a is perpendicular to the surface of the layer, and the dielectric constant and the remanent polarization are less for the lower layer 20a than for the layer of bismuth titanate of the stoichiometric composition.

The lower layer 20a is scheduled to constitute a ferroelectric layer, when it is combined with an upper layer 20b which will be produced in the later process.

Since the stoichiometric ratio of bismuth and titanium in bismuth titanate ($Bi_4Ti_3O_{12}$) is 4:3, the allowable ratio of bismuth and titanium in the first organic solvent solution is 4.08 through 4.6:3, and the appropriate ratio would be 4.4:3. The organic solvent solution containing bismuth and titanium at an arbitrary concentration is available at Kabushiki Kaisha Kojundo Kagaku Kenkyusho in Japan under the brand of "a solution employable for producing bismuth titanate by employing a metal organic decomposition method".

When the foregoing spin coating process is conducted, a drop of the first organic solvent solution is dropped on the surface of the platinum layer 18, and the silicon substrate 10 is rotated at 500 rpm for 10 seconds and later at 2500 rpm for 30 seconds.

The foregoing two-step thermal treatment process consists of a first thermal process conducted at 450° C. for 15 minutes to dry the spin coated film and a second thermal process conducted in a rapid thermal annealer (RTA) containing dry oxygen at 850° C. for 3 minutes to crystallize the dried film for resultantly producing a layer of bismuth titanate containing bismuth more than the stoichiometric quantity and having the thickness of e.g. 600 Å. The crystalline layer of bismuth titanate containing bismuth more than the stoichiometric quantity has the c-axis perpendicular to the surface of the layer and has the dielectric constant and the remanent polarization smaller than those of bismuth titanate of the stoichiometric composition.

The foregoing second thermal process conducted in a RTA can be replaced by a thermal treatment process conducted in the dry oxygen of 850° C. for 30 minutes in an ordinary electric furnace.

Referring to FIG. 1(C), a second organic solvent solution containing a bismuth source and a titanium source in the stoichiometric ratio of bismuth titanate or in the ratio of 4:3 is spin coated on the lower layer 20a, and a two-step thermal treatment process is applied to the spin coated film to produce the first layer 20b1 of an upper layer 20b of bismuth titanate of the stoichiometric composition and having a thickness of e.g. 600 Å.

When the foregoing spin coating process is conducted, a drop of the second organic solvent solution is dropped on the surface of the lower layer 20a of bismuth titanate containing bismuth more than the stoichiometric quantity, and silicon substrate 10 is rotated at 500 rpm for 10 seconds and later at 2500 rpm for 30 seconds.

The foregoing two-step thermal treatment process consists of a first thermal process conducted at 450° C. for 15 seconds to dry the spin coated film and a second thermal process conducted in a rapid thermal annealer (RTA) of 850° C. for 3 minutes to crystallize the dried film for producing a bismuth titanate of the stoichiometric composition or the first layer 20b1 of bismuth titanate of the stoichiometric composition. The direction of the c-axis of the lower layer 20a which is perpendicular to the surface of the layer is taken over by the first layer 20b1 of bismuth titanate of the stoichiometric composition. As a result, the c-axis of the first layer 20b1 of bismuth titanate of the stoichiometric composition directs perpendicular to the surface of the layer, and the dielectric constant and the remanent polarization of the first layer 20b1 of bismuth titanate of the stoichiometric composition is less than those of bismuth titanate of the stoichiometric composition.

Referring to FIG. 1(D), the foregoing process for producing a layer of bismuth titanate of the stoichiometric composition is repeated to produce the second and later layers 20$b$2 through 20$b$4 of bismuth titanate of the stoichiometric composition. Since the direction of the c-axis of the first layer 20$b$1 is taken over by the second and later layers 20$b$2 through 20$b$4 of bismuth titanate of the stoichiometric composition, these layers 20$b$2 through 20$b$4 have dielectric constant and remanent polarization less than those of bismuth titanate of the stoichiometric composition.

Referring to FIG. 2(A), a pile of the lower layer of bismuth titanate 20$a$ containing bismuth more than the stoichiometric quantity and having dielectric constant and remanent polarization less than bismuth titanate of the stoichiometric composition and the upper layer of bismuth titanate 20$b$ consisting of the second through fourth layers 20$b$1 through 20$b$4 of bismuth titanate of the stoichiometric composition which has dielectric constant and remanent polarization less than the ordinary bismuth titanate crystal, constitutes a ferroelectric layer 20 which has the thickness of e.g. 3000 Å and which has dielectric constant and remanent polarization less than the ordinary bismuth titanate crystal.

Referring to FIG. 2(B), a sputtering process is employed to produce a layer of ruthenium 22 having the thickness of 2000 Å on the ferroelectric layer 20. The ruthenium layer 22 is scheduled to be an upper conductive layer or a so-called gate electrode.

Referring to FIG. 2(C), a chemical vapor deposition process is employed to produce a layer of silicon dioxide 24 on the ruthenium layer 22. The silicon dioxide layer 24 is scheduled to be an etching mask for producing a gate out of a pile of the ruthenium layer 22, the ferroelectric layer 20, the platinum layer 18, the conductive silicon layer 16 and the silicon dioxide layer 14.

Referring to FIG. 3(A), a photolithography process is employed to pattern the silicon dioxide layer 24 into the horizontal shape of a gate electrode to produce an etching mask 24$\chi$. A dry etching process employing $CCl_4$ or $CF_4$ as the etchant gas is applied to the ruthenium layer 22 and the ferroelectric layer 20 by employing the etching mask 24$\chi$ to pattern these layers 22 and 20 into the horizontal shape of the gate electrode. A reactive ion etching process employing a magnetron reactive etching equipment is practically employed for this process to improve the throughput or the etching rate.

Referring to FIG. 3(B), an ion milling process is employed to pattern the platinum layer 18 into the horizontal shape of a gate electrode. The patterned layer of platinum 18$\chi$ is scheduled to act as the upper layer of a lower conductive layer, together with a patterned layer 16$\chi$ of poly crystalline conductive silicon. By this ion milling process, the thickness of the etching mask 24$\chi$ is remarkably decreased.

Referring to FIG. 3(C), a dry etching process employing $CCl_4$ or $CF_4$ as the etchant is employed to pattern the conductive poly crystalline silicon layer 16 and the silicon dioxide layer 14 into the horizontal shape of the gate electrode. The patterned layer 16$\chi$ of the conductive poly crystalline silicon layer 16 is scheduled to act as the lower layer of the lower conductive layer, together with patterned platinum layer 18$\chi$. The patterned silicon dioxide layer 14$\chi$ is scheduled to act as the so-called gate insulator layer. By this dry etching process, the etching mask 24$\chi$ is entirely removed.

By the foregoing processes, a gate consisting of a ruthenium layer 22$\chi$ acting as the upper conductive layer, a ferroelectric layer 20$\chi$ consisting of an upper layer 20$b\chi$ of a piled layer of bismuth titanate of the stoichiometric composition and a lower layer 20$a\chi$ of bismuth titanate containing bismuth more than the stoichiometric quantity, a lower conductive layer consisting of a platinum layer 18$\chi$ and a conductive poly crystalline silicon layer 16$\chi$ and a silicon dioxide layer 14$\chi$, has been produced.

Referring to FIG. 4(A), a low temperature chemical vapor deposition process is employed to cover the entire surface of a field effect transistor under production with a silicon dioxide layer 26. An anisotropic etching process is employed to expose the area on which a source and a drain are scheduled to be produced. A reactive ion etching process can be employed as the anisotropic etching method employable for this process.

Referring to FIG. 4(B), an ion implantation process is employed to introduce an n-type impurity e.g. phosphorus, arsenic or antimony to produce a source 28$a$ and a drain 28$b$. The reason why this ion implantation process is conducted after the processes for producing the silicon dioxide layer 26 and for patterning the same is to cover the side surface of the ferroelectric layer 20$\chi$ for the ultimate purpose to protect the side surface of the ferroelectric layer 20$\chi$ from potential damages caused by the implantation process. Since the thickness of the silicon dioxide layer 26 deposited on the side surface of the patterned piled layers does not exceed 2000 Å, and since the source 28$a$ and the drain 28$b$ laterally diffuse toward under the patterned piled layers, there is no possibilities in which the source 28$a$ and the drain 28$b$ fail to contact a channel which occurs under a gate.

Referring to FIG. 4(C), a chemical vapor deposition process is employed to cover the entire surface of the field effect transistor under production with a silicon dioxide layer or a phosphor-silicate glass layer 32. After contact holes 30 are produced to reach the source 28$a$ and the drain 28$b$, a selected tungsten chemical vapor deposition process is employed to produce a tungsten layer 34 on the entire surface of the field effect transistor under production. Thereafter, the tungsten layer 34 is removed, remaining it in the contact holes 30 to berry it. Finally, an aluminum layer is deposited and patterned to produce aluminum wires 36 which connect the source 28$a$ and the drain 28$b$ with external circuits.

The foregoing process has successfully produced a non-volatile semiconductor memory cell employing an MFMIS field effect transistor having a gate made of an upper conductive layer of ruthenium, a ferroelectric layer consisting of an upper layer of bismuth titanate of the stoichiometric composition but which has dielectric constant and remanent polarization less than those of bismuth titanate of the stoichiometric composition and a lower layer of bismuth titanate containing bismuth more than the stoichiometric quantity and which has dielectric constant and remanent polarization less than those of bismuth titanate of the stoichiometric composition, a lower conductive layer consisting of an upper layer of platinum and a lower layer of conductive poly crystalline silicon and an insulator layer of silicon dioxide, produced on the surface of a silicon layer or substrate of one conductivity, and a set of source and drain of the other conductivity produced in the surface region of the silicon layer or substrate of one conductivity, at the side of the gate, the non-volatile semiconductor memory cell being a non-volatile semiconductor memory cell in accordance with the first embodiment of this invention.

Since the foregoing ferroelectric layer consisting of an upper layer of bismuth titanate of the stoichiometric composition and a lower layer of bismuth titanate containing bismuth more than the stoichiometric quantity has a c-axis perpendicular to the surface of the layer and has a less amount of dielectric constant and remanent polarization, the foregoing field effect transistor is allowed to generate a large magnitude of the intensity of electric field, when it is applied even a less amount of voltage applied to the upper conductive layer of the gate. As a result, a non-volatile memory cell in accordance with the first embodiment of this invention is allowed to memorize or erase binary information with a less amount of the writing or erasing voltage which is to be applied between the gate electrode and the semiconductor substrate.

The electromagnetic characteristics of bismuth titanate containing bismuth more than the stoichiometric quantity has been experimentally determined.

Test pieces were produced by producing a ruthenium layer of 2000 Å thick on a layer of bismuth titanate which contains bismuth more than the stoichiometric quantity and which was produced by employing an organic solvent solution containing a bismuth source and a titanium source at a ratio of 4.4:3, the layer of bismuth titanate being produced on a platinum layer of 600 Å thick, the platinum layer being produced on a silicon dioxide layer of 2000 Å thick, the silicon dioxide layer being produced on a p-type silicon substrate. Hysteresis characteristics were measured by employing Sawer-tower circuit for the layer of bismuth oil titanate containing bismuth more than the stoichiometric quantity. The ruthenium layer and the platinum layer were employed as the electrodes. Paying an attention to the difference in work function between platinum and ruthenium, the amount of remanent polarization was determined to be approximately 1.8 $\mu C/cm^2$. The amount of dielectric constant and coercive field were determined to be approximately 67 and 12 KV/cm. Since bismuth titanate of the stoichiometric composition has the dielectric constant of 180, the remanent polarization of 4.4 $\mu C/cm^2$ and the coercive field of 84 KV/cm, and also since lead zirconate titanate has the dielectric constant of 875, the remanent polarization of 25.4 $\mu C/cm^2$ and the coercive field of 57.5 KV/cm, bismuth titanate containing bismuth more than the stoichiometric quantity was determined to be more appropriate as the ferroelectric material to be used for a field effect transistor in accordance with this invention than any of the ferroelectric materials available in the prior art. Accordingly, the field effect transistor in accordance with this invention is allowed to generate a sufficiently large amount of intensity of electric field by being applied a less voltage between the gate electrode and the semiconductor substrate.

Further, since bismuth titanate has a small amount of coercive field, the hysteresis characteristics are readily saturated by a less amount of the voltage to be applied to the gate, resultantly causing a less possibility of breakdown for the insulator layer arranged between the lower conductive layer and the semiconductor substrate.

Flatness was observed for the surface of a layer of bismuth titanate id containing bismuth more than the stoichiometric quantity. For his purpose, two test pieces were produced. The first one has a layer 3 of bismuth titanate of the stoichiometric composition produced on the surface of a layer 2 of bismuth titanate containing bismuth more than the stoichiometric quantity, the latter layer 2 of bismuth titanate being produced on a layer 1 of platinum. The second one has a layer 2 of bismuth titanate containing bismuth more than the stoichiometric quantity produced on the surface of the latter layer 2 of bismuth titanate containing bismuth more than the stoichiometric quantity, the latter layer 2 of bismuth titanate being produced on a layer 1 of platinum. The cross section of the two test pieces was observed with magnification of 20,000 by employing a scanning electronic microscope (SEM).

The result of the observation for the first one is illustrated in FIG. 5(A), and the result of the observation for the second one is illustrated in FIG. 5(B). FIG. 5(A) clearly shows a surface more flat than the surface shown in FIG. 5(B). As a result, it is clear that no local concentration of electric field occurs for the layer of bismuth titanate of the stoichiometric quantity produced on the layer of bismuth titanate containing bismuth more than the stoichiometric quantity.

Second Embodiment

A non-volatile semiconductor memory cell of an MFMIS field effect transistor having a gate of a ruthenium/bismuth titanate of the stoichiometric composition/bismuth titanate containing bismuth more than the stoichiometric quantity/ruthenium dioxide/ruthenium/conductive silicon/silicon dioxide/silicon structure.

Figure 6:
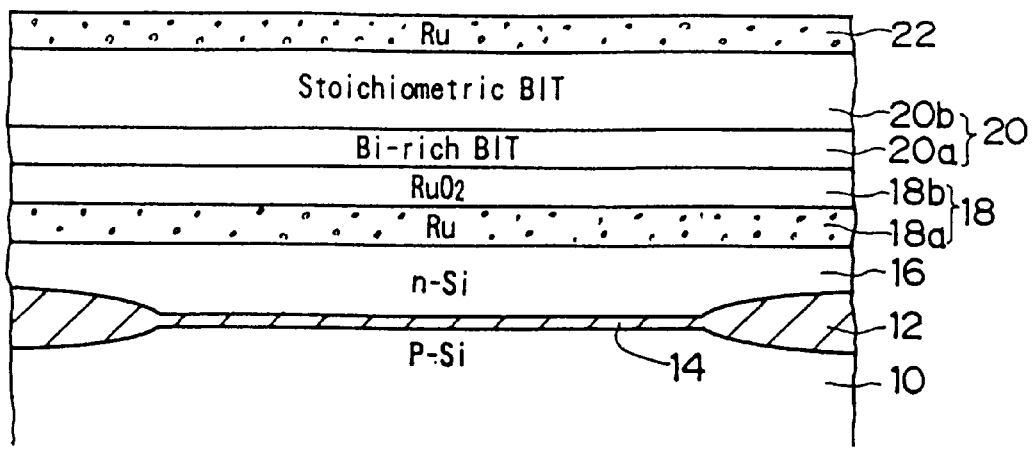
FIG. 6(A) is a cross section illustrating layer configuration of an MFMIS field effect transistor in accordance with a second embodiment of this invention, on the way of production.
FIG. 6(B) is a cross section illustrating layer configuration of an MFMIS field effect transistor in accordance with a second embodiment of this invention, on the way of production.
Figure 6:
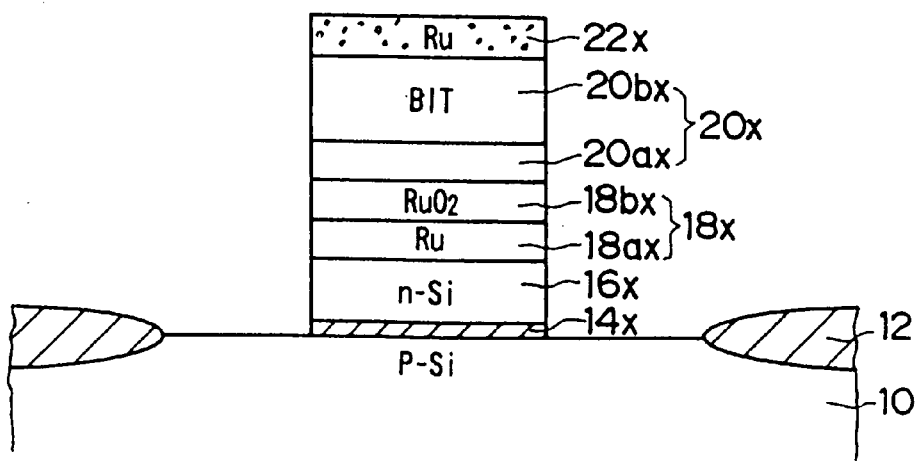

FIGS. 6(A) and (B) illustrate layer configuration of an MFMIS field effect transistor constituting a non-volatile semiconductor memory cell in accordance with a second embodiment of this invention, on the way of production Referring to FIG. 6(A), the steps to be employed for producing a field insulator layer 12, a silicon dioxide layer 14 and a conductive poly crystalline silicon layer 16, in this order, on a p-type silicon substrate 10 are identical to the corresponding steps employed in the process for the first embodiment of this invention. A sputtering process is employed to produce a layer of ruthenium 18a having an approximate thickness of 500 Å on the conductive poly crystalline silicon layer 16. Thereafter, a sputtering process is employed to produce a layer of ruthenium dioxide 18b having an approximate thickness of 1000 Å on the ruthenium layer 18a. A piled layer 18 of the ruthenium dioxide layer 18b and the ruthenium layer 18a, in combination with the conductive poly crystalline silicon layer 16, is allowed to act as a lower conductive layer or a so-called floating gate. A ferroelectric layer 20 consisting of a layer 20a of bismuth titanate containing bismuth more than the stoichiometric quantity and having a less amount of dielectric constant and remanent polarization and a layer 20b of bismuth titanate of the stoichiometric composition but having a less amount of dielectric constant and remanent polarization is produced by employing the corresponding steps employed in the process for the first embodiment of this invention.

The function of the ruthenium dioxide layer 18b is to compensate oxygen vacancy which often occurs in a ferroelectric material on the occasion that a ferroelectric layer had been fatigued. In other words, since the ferroelectric layer 20 is contacted by an oxide layer, specifically the ruthenium dioxide layer 18b, oxygen vacancy can readily be compensated. On the other hand, the function of the ruthenium layer 18a is to prevent the conductive poly crystalline silicon layer 16 from being oxidized and to improve the adhesion between the ruthenium dioxide layer 18b and the conductive poly crystalline silicon layer 16.

A sputtering process is employed to produce a layer of ruthenium 22 on the ferroelectric layer 20.

Referring to FIG. 6(B), a dry etching process employing $CCl_4$ or $CF_4$ as the etchant is employed to pattern a piled layer consisting of the ruthenium layer 22, the ferroelectric layer 20, the piled layer 18 of the ruthenium dioxide layer 18b and the ruthenium layer 18a, the conductive poly crystalline silicon layer 16 and the silicon dioxide layer 14, into the horizontal shape of the gate electrode. Since ruthenium and ruthenium dioxide can be readily etched by employing a dry etching process, the foregoing piled layer can be patterned with a single step. It is needless to emphasize that the process is remarkably simplified. Incidentally, since a dry etching process allows more minute etching accuracy than an ion milling process, a larger magnitude of integration can be expected for the non-volatile semiconductor memory cell employing the MFMIS field effect transistor in accordance with the second embodiment of this invention. The suffix "x" added to each layer indicates the patterned layer.

Third Embodiment

A non-volatile semiconductor memory cell of an MFMIS field effect transistor having a gate of a ruthenium/bismuth titanate of the stoichiometric composition/bismuth titanate containing bismuth more than the stoichiometric quantity/ bismuth titanate of the stoichiometric composition/ ruthenium dioxide/ruthenium/conductive silicon/silicon dioxide/silicon structure.

Figure 7:
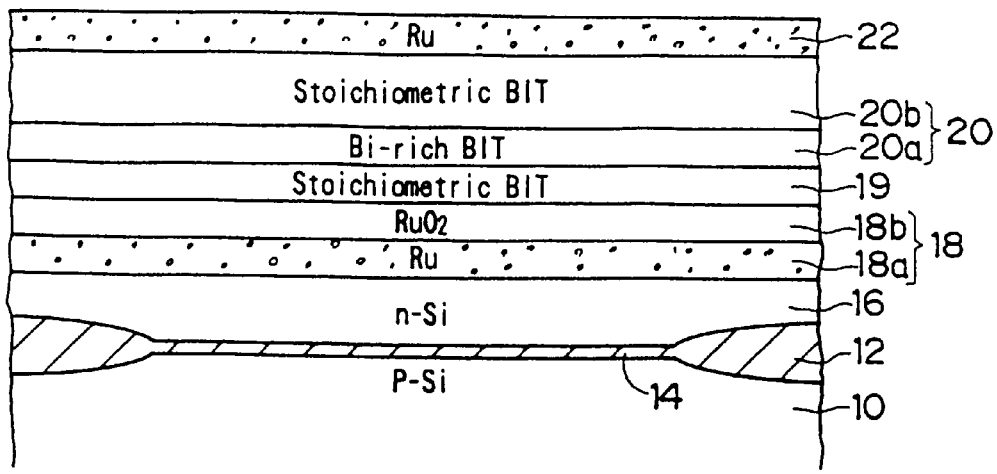
FIG. 7(A) is a cross section illustrating layer configuration of an MFMIS field effect transistor in accordance with a third embodiment of this invention, on the way of production.
FIG. 7(B) is a cross section illustrating layer configuration of an MFMIS field effect transistor in accordance with a third embodiment of this invention, on the way of production.
Figure 7:
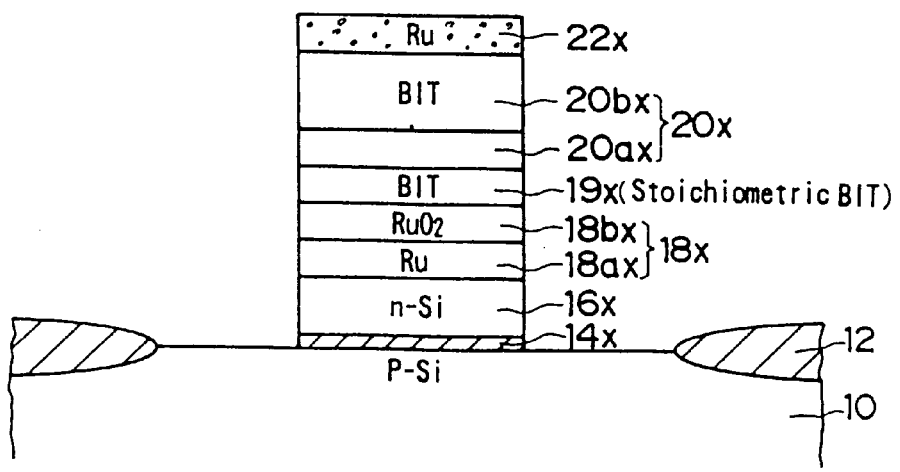

FIGS. 7(A) and (B) illustrate layer configuration of an MFMIS field effect transistor constituting a non-volatile semiconductor memory cell in accordance with a third embodiment of this invention, on the way of production.

Referring to FIG. 7(A), the steps to be employed for producing a field insulator layer 12, a silicon dioxide layer 14, a conductive poly crystalline silicon layer 16, a ruthenium layer 18a and a ruthenium dioxide layer 18b, in this order, on a p-type silicon substrate 10 are identical to the corresponding steps employed in the process for the second embodiment of this invention. A layer of bismuth titanate of the stoichiometric composition 19 is produced on the ruthenium dioxide layer 18b by employing a process identical to the process employed for producing the layer of bismuth titanate of the stoichiometric composition 20b1 in the first embodiment of this invention. The function of the layer of bismuth titanate of the stoichiometric composition 19 is to improve the flatness of the surface of the ruthenium dioxide layer 18b which is inclined to be slightly rough. Although the layer of bismuth titanate of the stoichiometric composition 19 does not have a less amount of dielectric constant and remanent polarization, it is effective to improve the flatness of the surface of the ruthenium dioxide layer 18b. A ferroelectric layer 20 and a ruthenium layer 22 are produced on the layer of bismuth titanate of the stoichiometric composition 19 by employing a process identical to the process employed for producing the ferroelectric layer 20 and a ruthenium layer 22 in the first and second embodiments of this invention.

Referring to FIG. 7(B), a dry etching process employing $CCl_4$ or $CF_4$ as the etchant is employed to pattern a piled layer consisting of the ruthenium layer 22, the ferroelectric layer 20, the layer of bismuth titanate of the stoichiometric composition 19, the piled layer 18 of the ruthenium dioxide layer 18b and the ruthenium layer 18a, the conductive poly crystalline silicon layer 16 and the silicon dioxide layer 14, into the horizontal shape of the gate electrode. The suffix "x" added to each layer indicates the patterned layer.

Fourth Embodiment

A non-volatile semiconductor memory cell of an MFMIS field effect transistor having a gate of a ruthenium/bismuth titanate of the stoichiometric composition/bismuth titanate containing bismuth more than the stoichiometric quantity/ bismuth titanate containing titanium more than the stoichiometric quantity/ruthenium dioxide/ruthenium/conductive silicon/silicon dioxide/silicon structure.

FIGS. 8(A) and (B) illustrate layer configuration of an MFMIS field effect transistor constituting a non-volatile semiconductor memory cell in accordance with a fourth embodiment of this invention, on the way of production.

Referring to FIG. 8(A), the steps to be employed for producing a field insulator layer 12, a silicon dioxide layer 14, a conductive poly crystalline silicon layer 16, a ruthenium layer 18a and a ruthenium dioxide layer 18b, in this order, on a p-type silicon substrate 10 are identical to the corresponding steps employed in the process for the second embodiment of this invention. A layer of bismuth titanate containing titanium more than the stoichiometric quantity 23 is produced on the ruthenium dioxide layer 18b by employing a process which is similar to the process employed for producing the layer of bismuth titanate containing bismuth more than the stoichiometric quantity employed in the first embodiment of this invention but which employs an organic solvent solution containing titanium more than the stoichiometric quantity.

The layer configuration of and the process for producing an MFMIS field effect transistor constituting a non-volatile semiconductor memory cell in accordance with the fourth embodiment of this invention are entirely identical to those for the third embodiment of this invention, excepting that the layer of bismuth titanate of the stoichiometric composition 19 is replaced by a layer of bismuth titanate containing titanium more than the stoichiometric quantity 23 and that the organic solvent solution containing a bismuth source and a titanium source at a mole ratio of 4:3 is replaced by an organic solvent solution containing a bismuth source and a titanium source at a mole ratio at which the titanium component is more than 3 and the bismuth component is 4. The results specific to this embodiment are that the ferroelectric layer is more flat in this embodiment than in the third embodiment and that a leak current flowing in the ferroelectric layer is less in this embodiment than in the third embodiment.

Fifth Embodiment

A non-volatile semiconductor memory cell of an MFMIS field effect transistor having a gate of an iridium dioxide/ bismuth titanate of the stoichiometric composition/bismuth titanate containing bismuth more than the stoichiometric quantity/iridium dioxide/iridium/conductive silicon/silicon dioxide/silicon structure.

Figure 9:
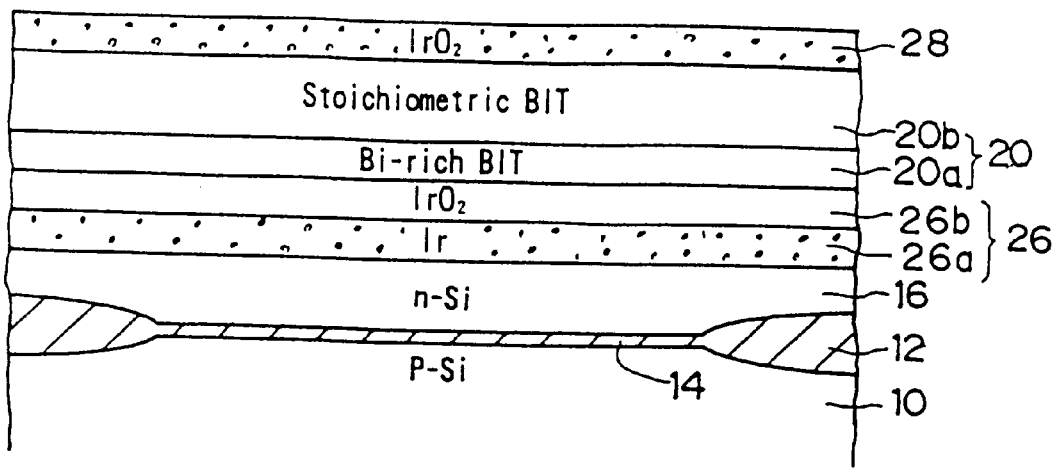
FIG. 9(A) is a cross section illustrating layer configuration of an MFMIS field effect transistor in accordance with a fifth embodiment of this invention, on the way of production.
FIG. 9(B) is a cross section illustrating layer configuration of an MFMIS field effect transistor in accordance with a fifth embodiment of this invention, on the way of production.
Figure 9:
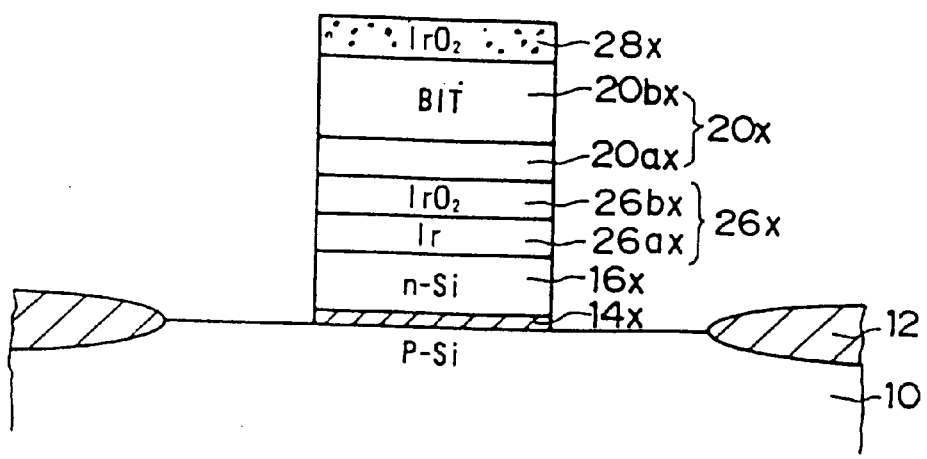

FIGS. 9(A) and (B) illustrate layer configuration of an MFMIS field effect transistor constituting a non-volatile semiconductor memory cell in accordance with a fifth embodiment of this invention, on the way of production.

Referring to FIG. 9(A), the steps to be employed for producing a field insulator layer 12, a silicon dioxide layer 14 and a conductive poly crystalline silicon layer 16, in this order, on a p-type silicon substrate 10 are identical to the corresponding steps employed in the process for the first embodiment of this invention. A sputtering process is employed to produce a layer of iridium 26a having an approximate thickness of 500 Å on the conductive poly crystalline silicon layer 16. Thereafter, a sputtering process is employed to produce a layer of iridium dioxide 26b having an approximate thickness of 1000 Å on the iridium layer 26a. A piled layer 26 of the iridium dioxide layer 26b and the iridium layer 26a, in combination with the conductive poly crystalline silicon layer 16, is allowed to act as a lower conductive layer or a so-called floating gate. A ferroelectric layer 20 consisting of a layer 20a of bismuth titanate containing bismuth more than the stoichiometric quantity and having a less amount of dielectric constant and remanent polarization and a layer 20b of bismuth titanate of the stoichiometric composition but having a less amount of dielectric constant and remanent polarization is produced by employing the corresponding steps employed in the process for the first embodiment of this invention.

The function of the iridium dioxide layer 26b is to compensate oxygen vacancy which often occurs in a ferroelectric material on the occasion that a ferroelectric layer had been fatigued. In other words, since the ferroelectric layer 20 is contacted by an oxide layer, specifically the iridium dioxide layer 26b, oxygen vacancy can readily be compensated. On the other hand, the function of the iridium layer 26a is to prevent the conductive poly crystalline silicon layer 16 from being oxidized and to improve the adhesion between the iridium dioxide layer 26b and the conductive poly crystalline silicon layer 16.

A sputtering process is employed to produce a layer of iridium oxide 28 on the ferroelectric layer 20.

Referring to FIG. 9(B), a dry etching process employing $CCl_4$ or $CF_4$ as the etchant is employed to pattern a piled layer consisting of the iridium oxide layer 28, the ferroelectric layer 20, the piled layer 26 of the iridium dioxide layer 26b and the iridium layer 26a, the conductive poly crystalline silicon layer 16 and the silicon dioxide layer 14, into the horizontal shape of the gate electrode. Since iridium and iridium dioxide can be readily etched by employing a dry etching process, the foregoing piled layer can be patterned with a single step. It is needless to emphasize that the process is remarkably simplified. Incidentally, since a dry etching process allows more minute etching accuracy than an ion milling process, a larger magnitude of integration can be expected for the non-volatile semiconductor memory cell employing the MFMIS field effect transistor in accordance with the fifth embodiment of his invention. The suffix "x" added to each layer indicates the patterned layer.

Sixth Embodiment

A non-volatile semiconductor memory cell of an MFMIS field effect transistor having a gate of an iridium dioxide/bismuth titanate of the stoichiometric composition/bismuth titanate containing bismuth more than the stoichiometric quantity/bismuth titanate of the stoichiometric composition/iridium dioxide/iridium/conductive silicon/silicon dioxide/silicon structure.

Figure 10:
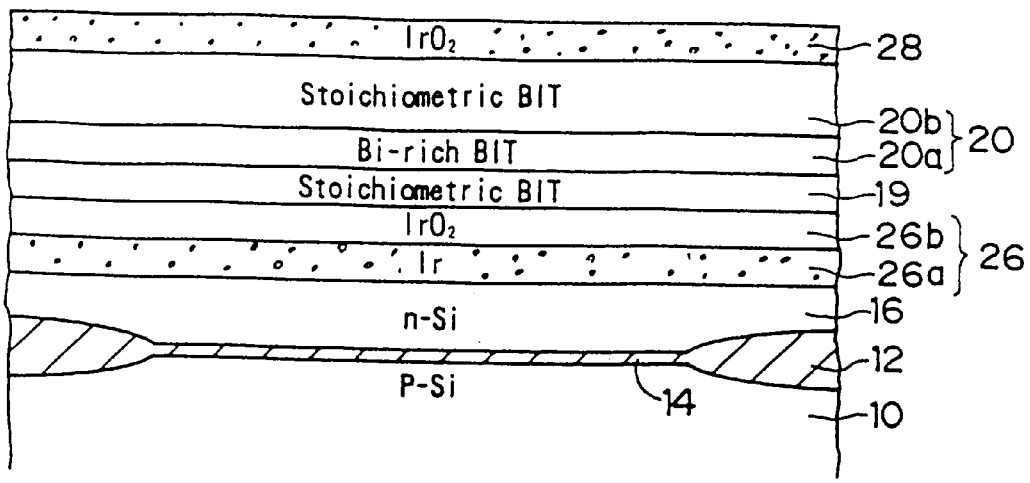
FIG. 10(A) is a cross section illustrating layer configuration of an MFMIS field effect transistor in accordance with a sixth embodiment of this invention, on the way of production.
FIG. 10(B) is a cross section illustrating layer configuration of an MFMIS field effect transistor in accordance with a sixth embodiment of this invention, on the way of production.
Figure 10:
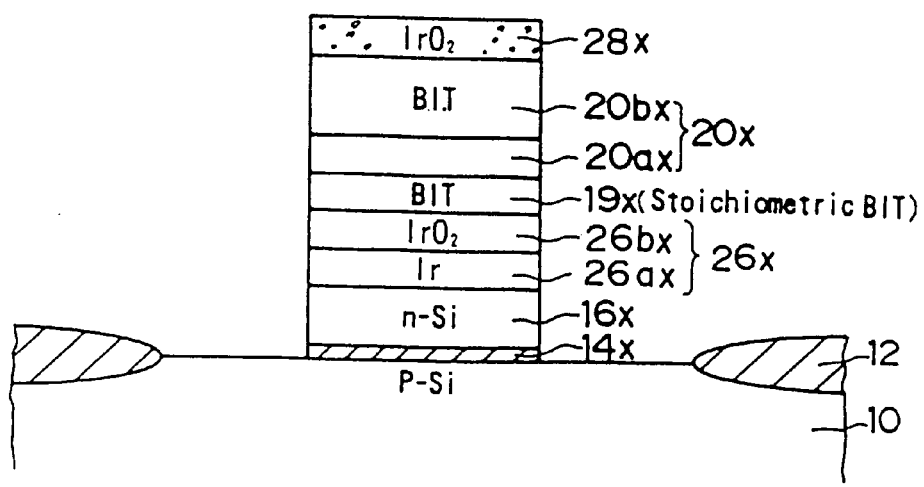

FIGS. 10(A) and (B) illustrate layer configuration of an MFMIS field effect transistor constituting a non-volatile semiconductor memory cell in accordance with a sixth embodiment of this invention, on the way of production.

Referring to FIG. 10(A), the steps to be employed for producing a field insulator layer 12, a silicon dioxide layer 14, a conductive poly crystalline silicon layer 16, an iridium layer 26a and an iridium dioxide layer 26b, in this order, on a p-type silicon substrate 10 are identical to the corresponding steps employed in the process for the second embodiment of this invention. A layer of bismuth titanate of the stoichiometric composition 19 is produced on the iridium dioxide layer 26b by employing a process identical to the process employed for producing the layer of bismuth titanate of the stoichiometric composition 20b1 in the first embodiment of this invention. The function of the layer of bismuth titanate of the stoichiometric composition 19 is to improve the flatness of the surface of the iridium dioxide layer 26b which is inclined to be slightly rough. Although the layer of bismuth titanate of the stoichiometric composition 19 does not have a less amount of dielectric constant and remanent polarization, it is effective to improve the flatness of the surface of the iridium dioxide layer 26b. A ferroelectric layer 20 and an iridium dioxide layer 28 are produced on the layer of bismuth titanate of the stoichiometric composition 19 by employing a process identical to the process employed for producing the ferroelectric layer 20 and a ruthenium layer 22 in the first and second embodiments of this invention.

Referring to FIG. 10(B), a dry etching process employing $CCl_4$ or $CF_4$ as the etchant is employed to pattern a piled layer consisting of the iridium dioxide layer 28, the ferroelectric layer 20, the layer of bismuth titanate of the stoichiometric composition 19, the piled layer 26 of the iridium dioxide layer 26b and the iridium layer 26a, the conductive poly crystalline silicon layer 16 and the silicon dioxide layer 14, into the horizontal shape of the gate electrode. The suffix "x" added to each layer indicates the patterned layer.

Seventh Embodiment

A non-volatile semiconductor memory cell of an MFMIS field effect transistor having a gate of an iridium dioxide/bismuth titanate of the stoichiometric composition/bismuth titanate containing bismuth more than the stoichiometric quantity/bismuth titanate containing titanium more than the stoichiometric quantity/iridium dioxide/iridium/conductive silicon/silicon/dioxide/silicon structure.

Figure 11:
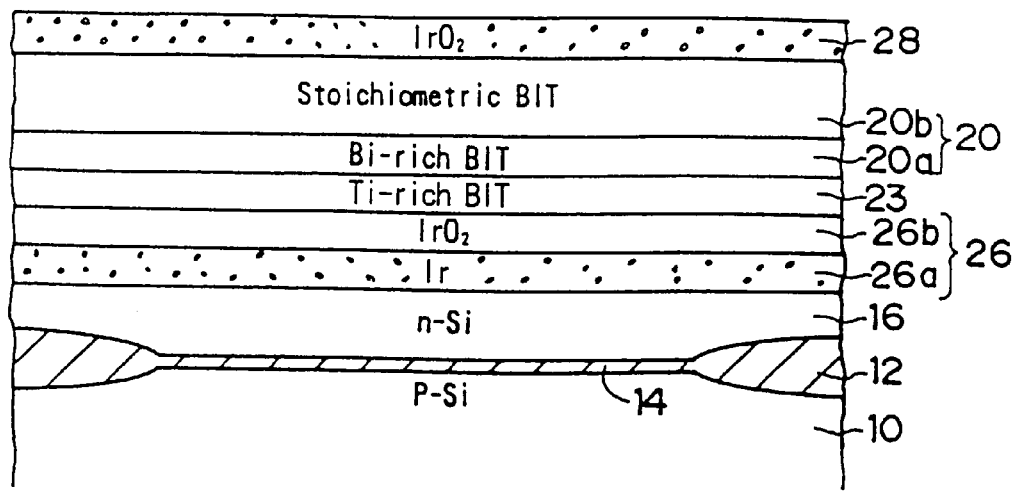
FIG. 11(A) is a cross section illustrating layer configuration of an MFMIS field effect transistor in accordance with a seventh embodiment of tis invention, on the way of production.
FIG. 11(B) is a cross section illustrating layer configuration of an MFMIS field effect transistor in accordance with a seventh embodiment of this invention, on the way of production.
Figure 11:
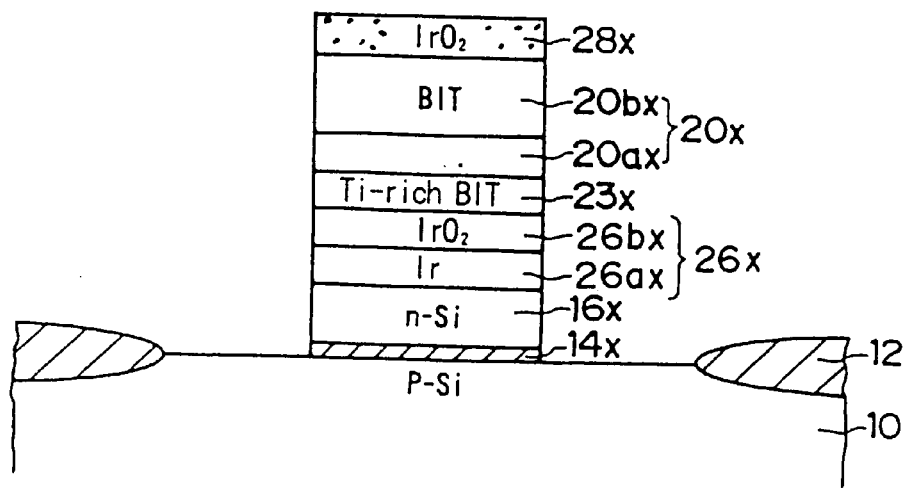

FIGS. 11(A) and (B) illustrate layer configuration of an MFMIS field effect transistor constituting a non-volatile semiconductor memory cell in accordance with a seventh embodiment of this invention, on the way of production.

Referring to FIG. 11(A), the steps to be employed for producing a field insulator layer 12, a silicon dioxide layer 14, a conductive poly crystalline silicon layer 16, an iridium layer 26a and an iridium dioxide layer 26b, in this order, on a p-type silicon substrate 10 are identical to the corresponding steps employed in the process for the second embodiment of this invention. A layer of bismuth titanate containing titanium more than the stoichiometric quantity 23 is produced on the iridium dioxide layer 26b by employing a process which is similar to the process employed for producing the layer of bismuth titanate containing bismuth more than the stoichiometric quantity employed in the first embodiment of this invention but which employs an organic solvent solution containing titanium more than the stoichiometric quantity.

The layer configuration of and the process for producing an MFMIS field effect transistor constituting a non-volatile semiconductor memory cell in accordance with the seventh embodiment of this invention are entirely identical to those for the third embodiment of this invention, excepting that the layer of bismuth titanate of the stoichiometric composition 19 is replaced by a layer of bismuth titanate containing titanium more than the stoichiometric quantity 23 and that the organic solvent solution containing a bismuth source and a titanium source at a mole ratio of 4:3 is replaced by an organic solvent solution containing a bismuth source and a titanium source at a mole ratio at which the titanium component is more than 3 and the bismuth component is 4. The results specific to this embodiment are that the ferroelectric layer is more flat in this embodiment than in the sixth embodiment and that a leak current flowing in the ferroelectric layer is less in this embodiment than in the sixth embodiment.

The foregoing description has clarified that a non-volatile semiconductor memory cell employing an MFS or MFMIS field effect transistor which allows a less amount of voltage to be to be applied between the gate electrode and the semiconductor substrate, to write a piece of binary information therein and to erase the piece of binary information therefrom and a method for producing it, are successfully provided by this invention.

Although this invention has been described with reference to specific embodiments, this description is not meant to be construed in a limiting sense. Various modifications of the disclosed embodiments, as well as other embodiments of this invention, will be apparent to persons skilled in the art upon reference to the description of this invention. It is therefore contemplated that the appended claims will cover any such modifications or embodiments as fall within the true scope of this invention.

What is claimed is:

1. A method for producing a non-volatile semiconductor memory cell comprising:

a step for producing a pile of layers comprising an upper conductive layer and a ferroelectric layer of bismuth titanate containing bismuth more than the stoichiometric quantity, on the surface of a semiconductor layer of one conductivity, a step for patterning said pile of layers to produce a gate, and a step for introducing an impurity of the other conductivity in said semiconductor layer of one conductivity to produce a set of source and drain, at the side of said gate, to finally produce a field effect transistor, wherein:

the step for producing said ferroelectric layer comprising a step for spin coating an organic solvent solution containing a bismuth source and a titanium source at a mole ratio at which the bismuth component is more than 4 and the titanium component is 3 and a step for applying a thermal treatment process for drying and crystallizing the spin coated film.

2. A method for producing a non-volatile semiconductor memory cell comprising:

a step for producing a pile of layers comprising an upper conductive layer and a ferroelectric layer comprising an upper layer of bismuth titanate of the stoichiometric composition and a lower layer of bismuth titanate containing bismuth more than the stoichiometric quantity, on the surface of a semiconductor layer of one conductivity, a step for patterning said pile of layers to produce a gate and a step for introducing an impurity of the other conductivity in said semiconductor layer of one conductivity to produce a set of source and drain, at the side of said gate, to finally produce a field effect transistor, wherein:

the step for producing said ferroelectric layer comprising a first step comprising a step for spin coating an organic solvent solution containing a bismuth source and a titanium source at a mole ratio at which the bismuth component is more than 4 and the titanium component is 3 and a step for applying a thermal treatment process for drying and crystallizing the spin coated film to produce said lower layer and a second step comprising a step for spin coating an organic solvent solution containing a bismuth source and a titanium source at a mole ratio of 4:3 and a step for applying a thermal treatment process for drying and crystallizing the spin coated film to produce said upper layer.

3. A method for producing a non-volatile semiconductor memory cell comprising:

a step for producing a pile of layers comprising an upper conductive layer, a ferroelectric layer of bismuth titanate containing bismuth more than the stoichiometric quantity, a lower conductive layer and an insulator layer, on the surface of a semiconductor layer of one conductivity, a step for patterning said pile of layers to produce a gate and a step for introducing an impurity of the other conductivity in said semiconductor layer of one conductivity to produce a set of source and drain, at the side of said gate, to finally produce a field effect transistor, wherein:

the step for producing said ferroelectric layer comprising a step for spin coating an organic solvent solution containing a bismuth source and a titanium source at a mole ratio at which the bismuth component is more than 4 and the titanium component is 3 and a step for applying a thermal treatment process for drying and crystallizing the spin coated film.

4. A method for producing a non-volatile semiconductor memory cell comprising:

a step for producing a pile of layers comprising an upper conductive layer, a ferroelectric layer comprising an upper layer of bismuth titanate of the stoichiometric composition and a lower layer of bismuth titanate containing bismuth more than the stoichiometric quantity, a lower conductive layer and an insulator layer, on the surface of a semiconductor layer of one conductivity, a step for patterning said pile of layers to produce a gate and a step for introducing an impurity of the other conductivity in said semiconductor layer of one conductivity to produce a set of source and drain, at the side of said gate, to finally produce a field effect transistor, wherein:

the step for producing said ferroelectric layer comprising a first step comprising a step for spin coating an organic solvent solution containing a bismuth source and a titanium source at a mole ratio at which the bismuth component is more than 4 and the titanium component is 3 and a step for applying a thermal treatment process for drying and crystallizing the spin coated film to produce said lower layer and a second step comprising a step for spin coating an organic solvent solution containing a bismuth source and a titanium source at a mole ratio of 4:3 and a step for applying a thermal treatment process for drying and crystallizing the spin coated film to produce said upper layer.

* * * * *